United States Patent
Shen et al.

(10) Patent No.: US 11,398,383 B2
(45) Date of Patent: Jul. 26, 2022

(54) SEMICONDUCTOR STRUCTURE AND METHOD FOR FORMING THE SAME

(71) Applicant: Winbond Electronics Corp., Taichung (TW)

(72) Inventors: Hsin-Huang Shen, Taoyuan (TW); Yu-Shu Cheng, Taichung (TW); Chun-Sheng Lu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/909,300

(22) Filed: Jun. 23, 2020

(65) Prior Publication Data

US 2021/0398813 A1  Dec. 23, 2021

(51) Int. Cl.
*H01L 21/28* (2006.01)
*H01L 29/66* (2006.01)
*H01L 21/8234* (2006.01)

(52) U.S. Cl.
CPC .. *H01L 21/28097* (2013.01); *H01L 21/28176* (2013.01); *H01L 21/823443* (2013.01); *H01L 21/823468* (2013.01); *H01L 29/665* (2013.01); *H01L 29/6653* (2013.01); *H01L 29/6656* (2013.01)

(58) Field of Classification Search
CPC ........... H01L 21/28065; H01L 21/2255; H01L 21/28518; H01L 21/823443; H01L 21/28052; H01L 21/28097; H01L 21/823835; H01L 21/823864; H01L 21/823468; H01L 29/665; H01L 29/66507; H01L 29/4933; H01L 29/66553; H01L 29/6653; H01L 29/6656
See application file for complete search history.

(56) References Cited

U.S. PATENT DOCUMENTS

| | | | | |
|---|---|---|---|---|
| 6,448,167 | B1 * | 9/2002 | Wang | H01L 29/665 257/E21.438 |
| 7,446,007 | B2 * | 11/2008 | Adkisson | H01L 29/4983 257/E21.205 |
| 7,449,410 | B2 | 11/2008 | Hu | |
| 7,779,682 | B2 | 8/2010 | Kurtz et al. | |
| 9,012,282 | B2 | 4/2015 | Hsu et al. | |
| 2002/0064919 | A1 * | 5/2002 | Wang | H01L 29/4983 438/305 |
| 2004/0155269 | A1 * | 8/2004 | Yelehanka | H01L 21/76897 257/288 |

(Continued)

FOREIGN PATENT DOCUMENTS

TW   I571914 B   2/2017

*Primary Examiner* — Jose R Diaz
(74) *Attorney, Agent, or Firm* — Muncy, Geissler, Olds & Lowe, P.C.

(57) ABSTRACT

A method for forming a semiconductor structure includes forming a gate electrode layer over a semiconductor substrate, forming a first spacer layer to cover a sidewall of the gate electrode layer, recessing the first spacer layer to expose an upper portion of the sidewall of the gate electrode layer, forming a metal material to cover an upper surface and the upper portion of the sidewall of the gate electrode layer; reacting a semiconductor material of the gate electrode layer with the metal material using an anneal process to form a silicide layer, and removing the metal material after the anneal process.

19 Claims, 9 Drawing Sheets

(56) References Cited

U.S. PATENT DOCUMENTS

| | | | |
|---|---|---|---|
| 2006/0183281 A1* | 8/2006 | Cremonesi | H01L 27/11526 257/E21.209 |
| 2009/0001479 A1* | 1/2009 | Wiatr | H01L 29/66545 257/384 |
| 2015/0155173 A1* | 6/2015 | Hirota | H01L 21/022 438/682 |

* cited by examiner

SEMICONDUCTOR STRUCTURE AND METHOD FOR FORMING THE SAME

BACKGROUND

Field of the Disclosure

The present disclosure relates to a semiconductor structure, and in particular, it relates to a silicide layer of a semiconductor structure.

Description of the Related Art

In order to increase element density in a flash memory device and improve its overall performance, existing technologies for fabricating flash memory devices continue to focus on scaling down the size of the elements. However, in scaling down the minimum size of the features (e.g., contacts), new challenges arise. Therefore, there is a need in the industry to improve the method of fabricating flash memory devices to overcome problems caused by scaling down the size of the elements.

SUMMARY

In some embodiments of the disclosure, a method for forming a semiconductor structure is provided. The method includes forming a gate electrode layer over a semiconductor substrate, forming a first spacer layer to cover a sidewall of the gate electrode layer, recessing the first spacer layer to expose an upper portion of the sidewall of the gate electrode layer, forming a metal material to cover an upper surface and the upper portion of the sidewall of the gate electrode layer, reacting a semiconductor material of the gate electrode layer with the metal material using an anneal process to form a silicide layer, and removing the metal material after the anneal process.

In some embodiments of the disclosure, a semiconductor structure is provided. The semiconductor structure includes a semiconductor substrate, a gate electrode layer disposed over the semiconductor substrate, a silicide layer wrapping around an upper portion of the gate electrode layer, and a first spacer layer surrounding a lower portion of the gate electrode layer. The silicide layer includes a central portion and a peripheral portion around the central portion. A first bottom surface of the peripheral portion is located at a same level as an upper surface of the first spacer layer.

BRIEF DESCRIPTION OF THE DRAWINGS

The present disclosure can be further understood by reading the subsequent detailed description and examples with references made to the accompanying drawings, wherein.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Throughout the various views and illustrative embodiments, like reference numbers are used to designate like elements.

Figure 1A:
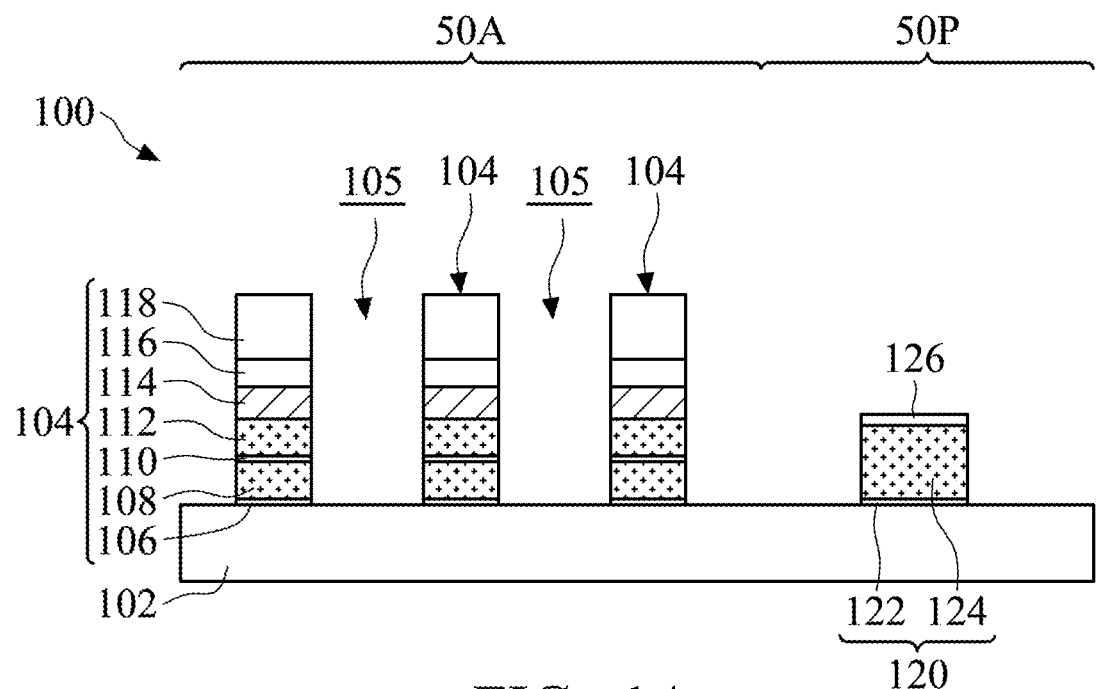
FIGS. 1A-1N illustrate cross-sectional views of forming a semiconductor structure at various stages in accordance with some embodiments of the present disclosure.
Figure 1B:
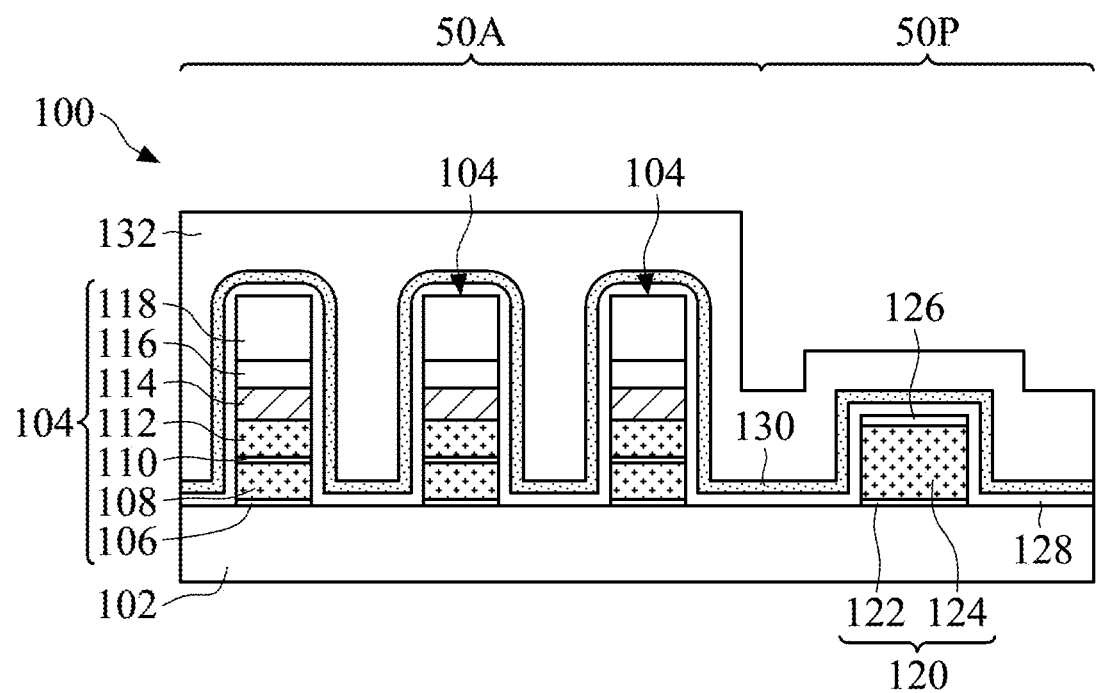
FIG. 1J-1 is a portion of the semiconductor structure of FIG. 1J to illustrate additional details in accordance with some embodiments of the present disclosure.
Figure 1C:
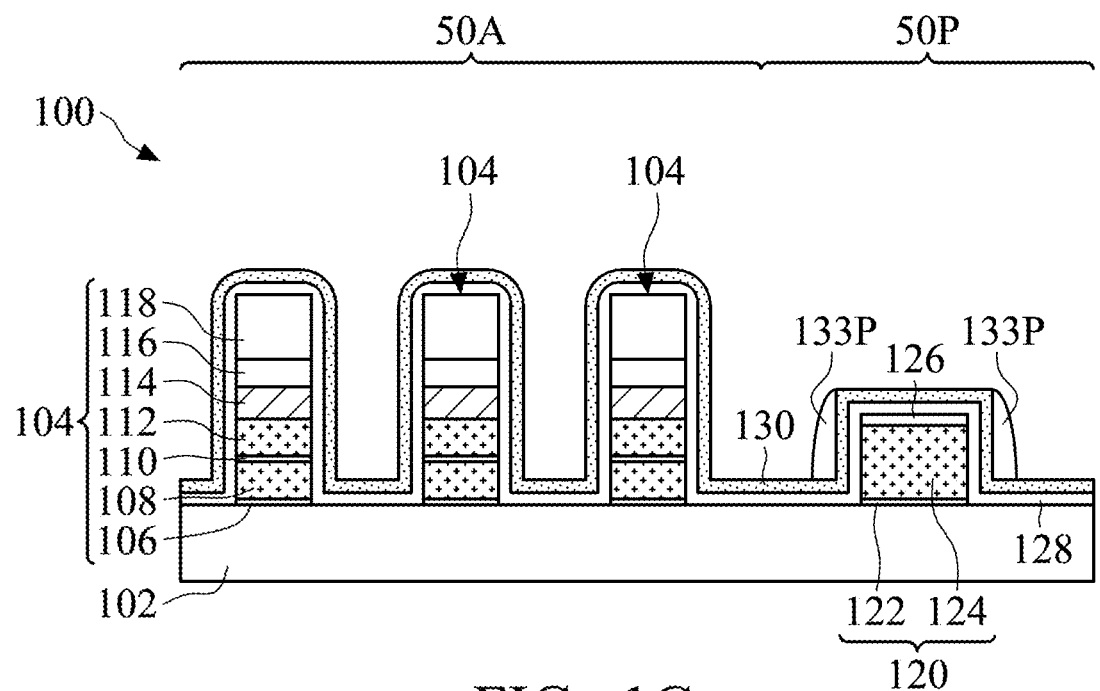
Figure 1D:
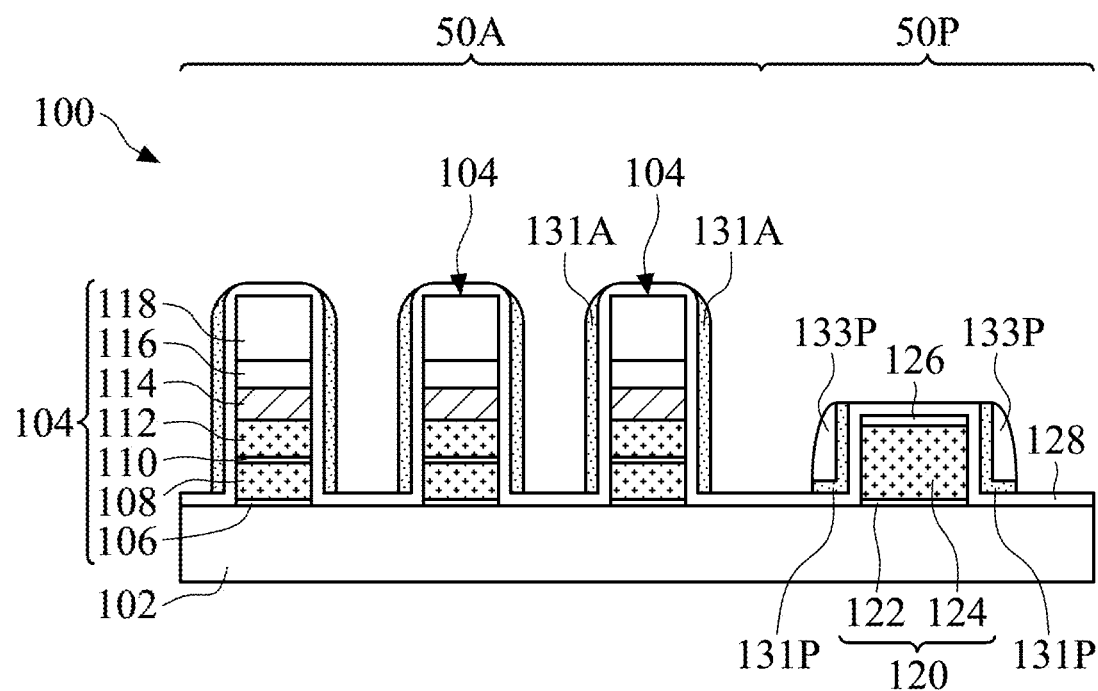
Figure 1E:
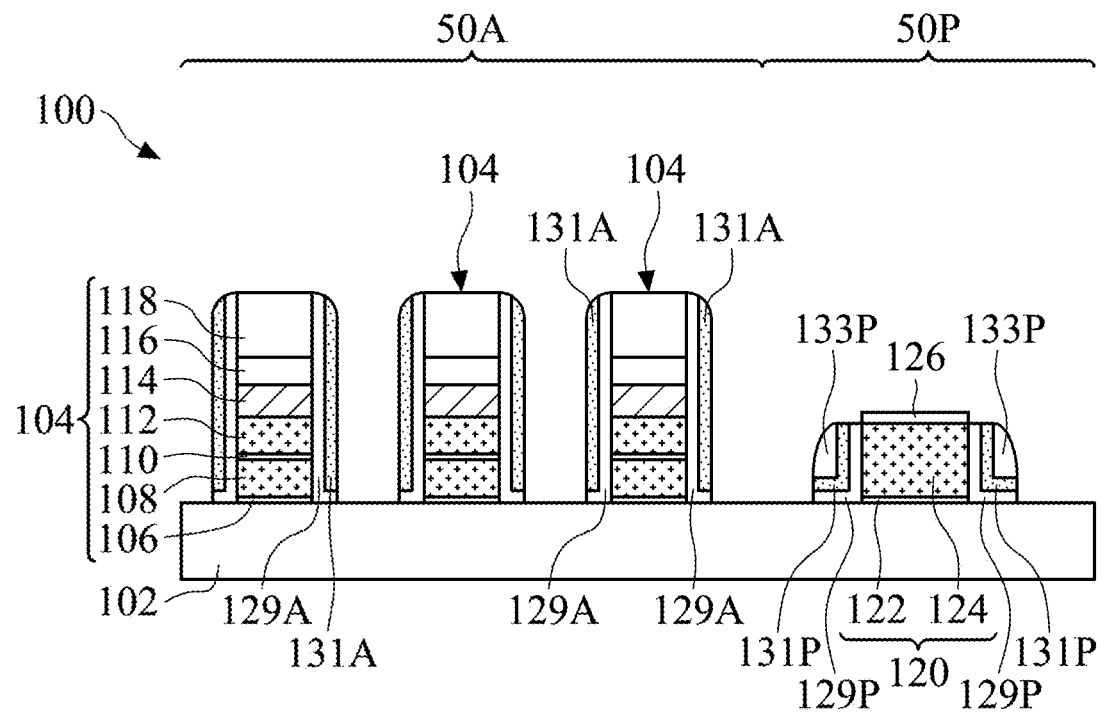
Figure 1F:
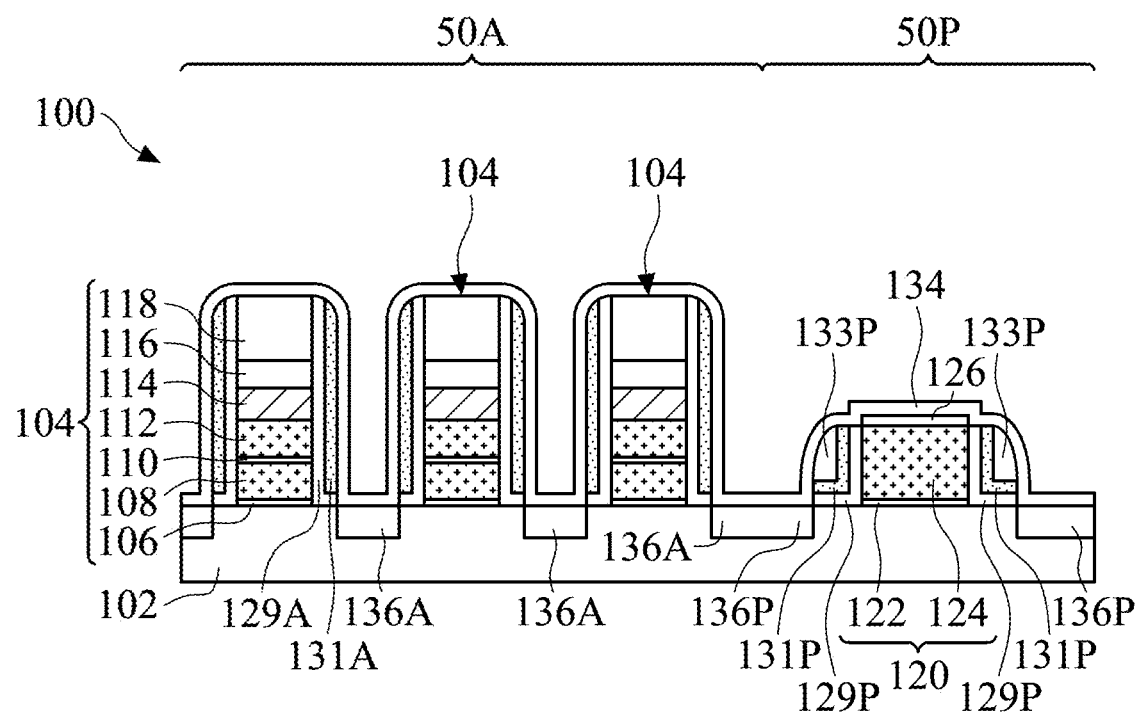
Figure 1G:
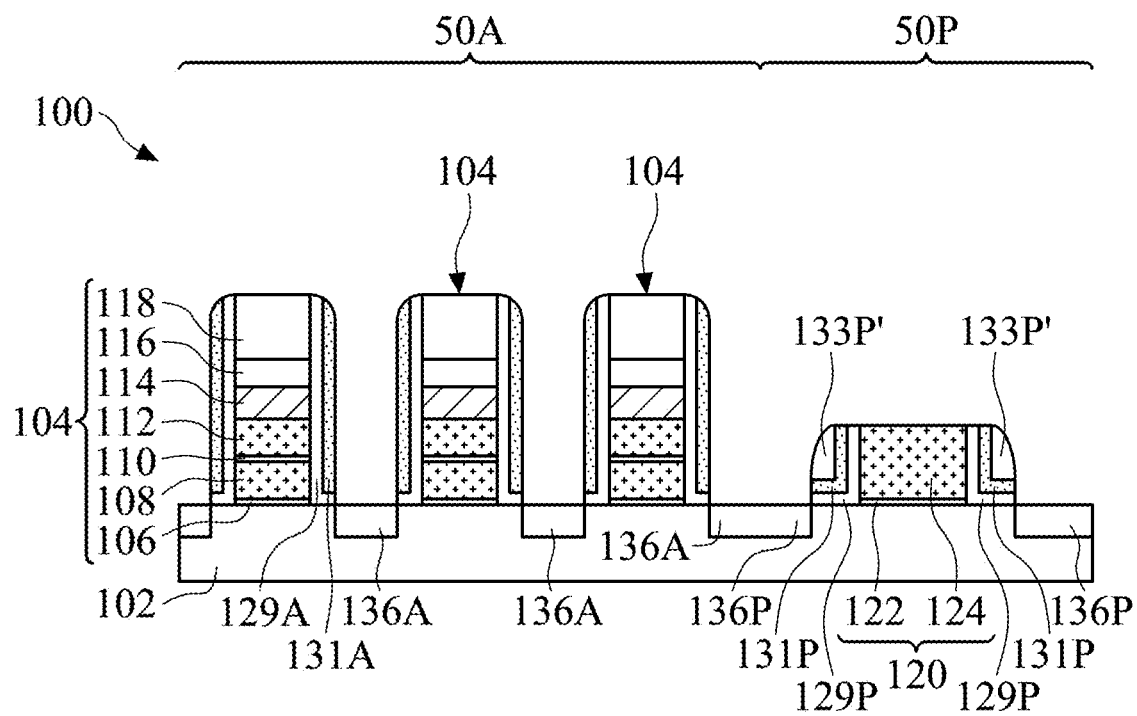
Figure 1H:
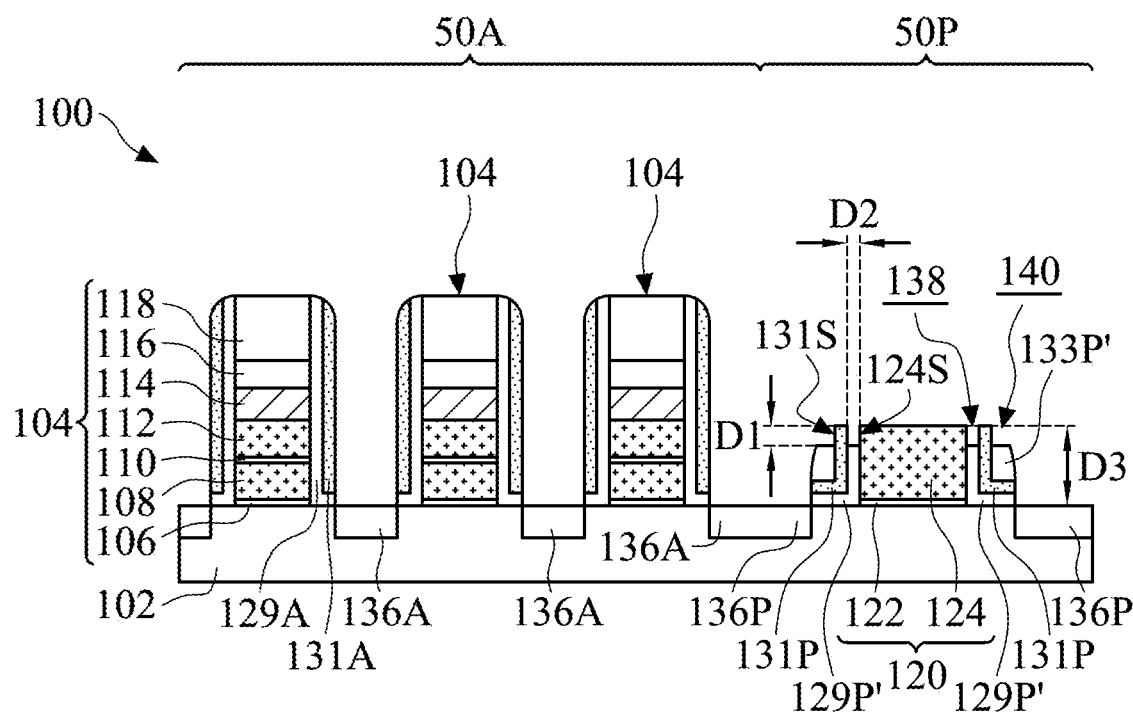
Figure 1I:
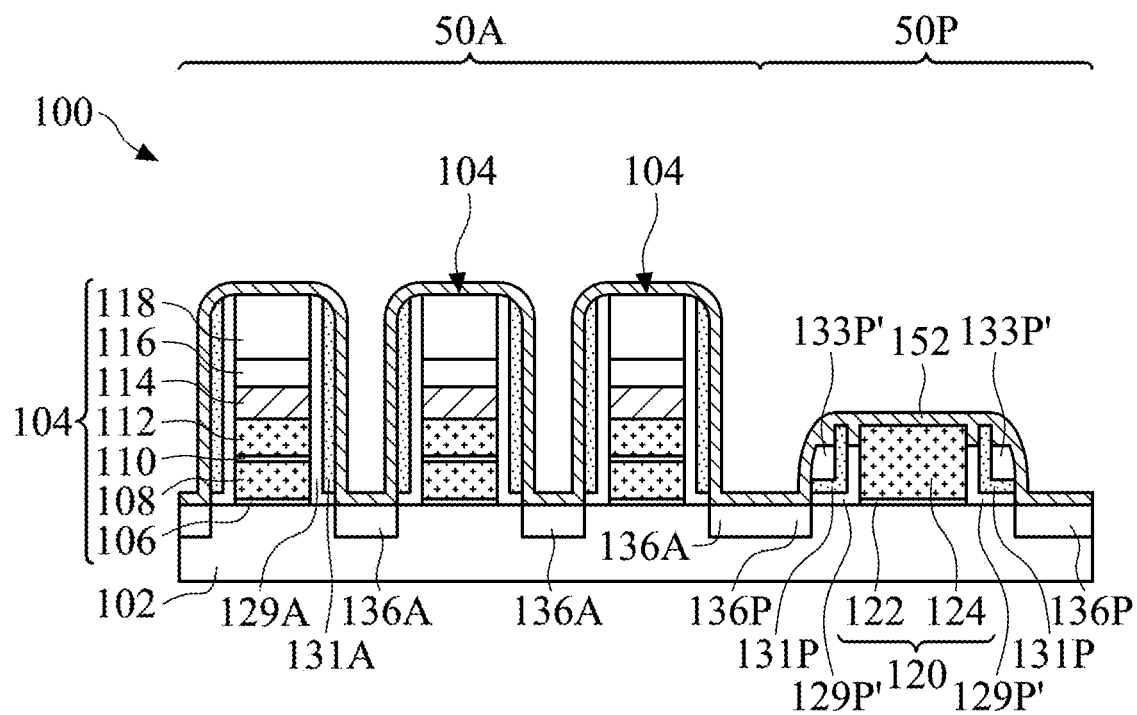
Figure 1J:
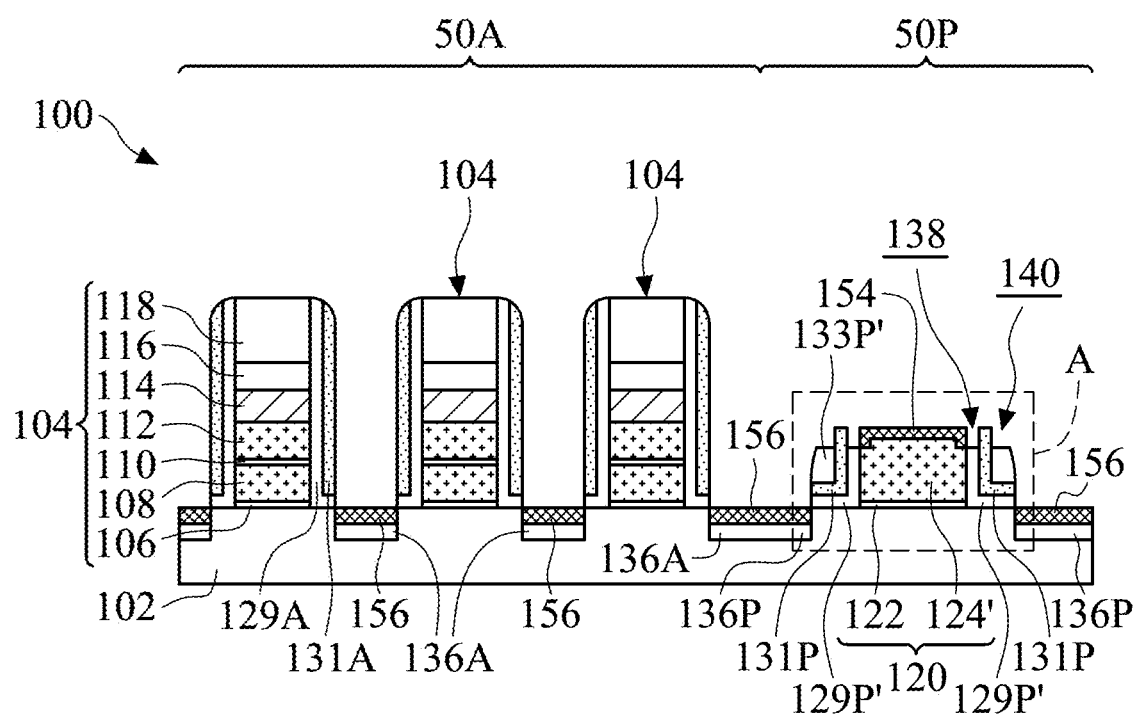
Figures 1, 1J:
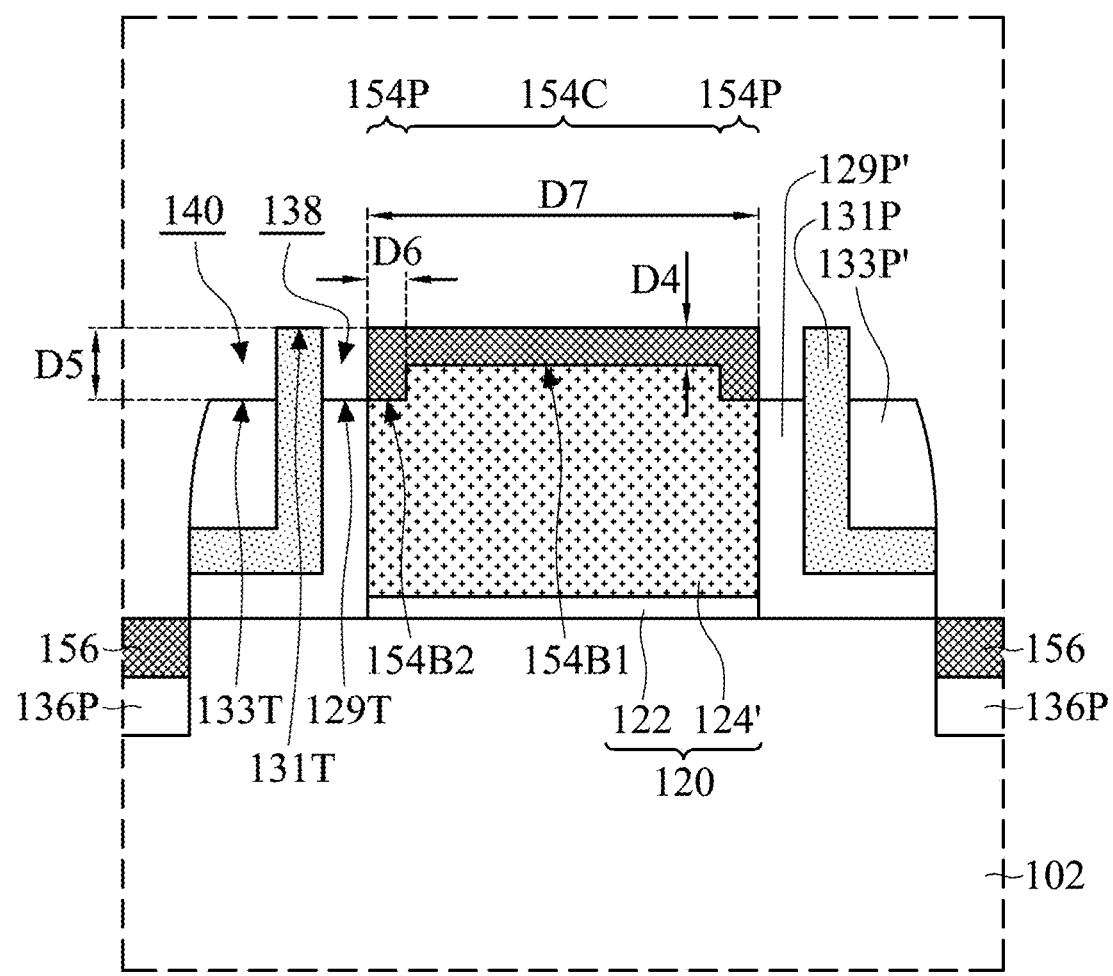
Figure 1K:
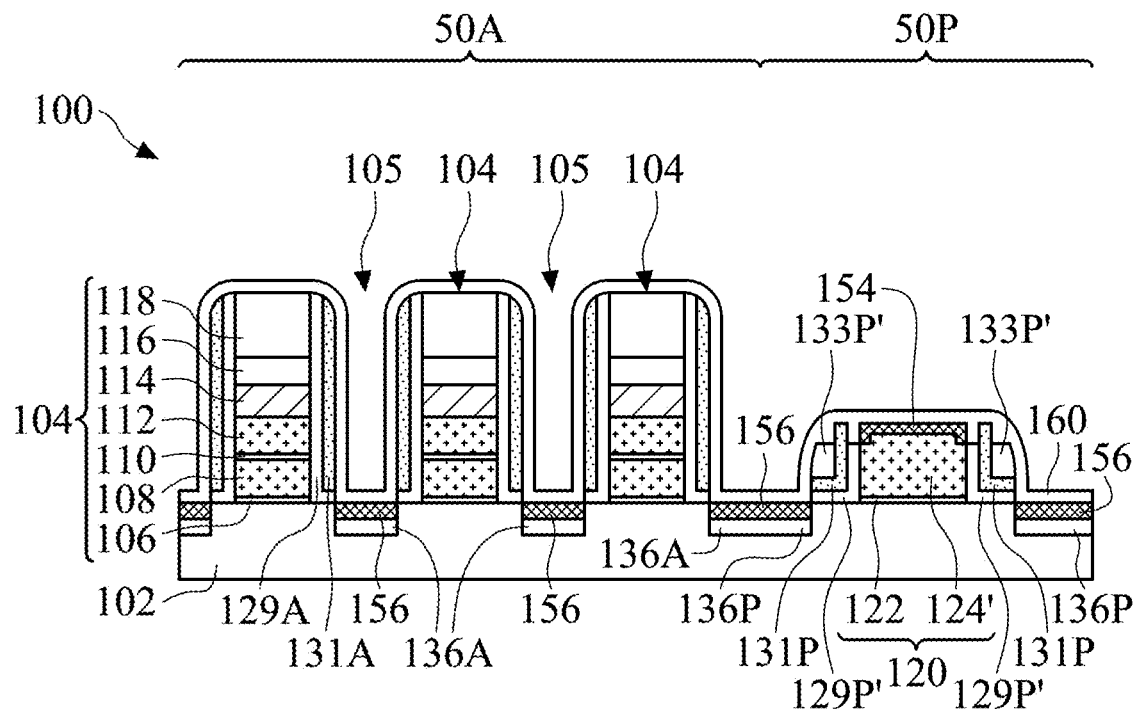
Figure 1L:
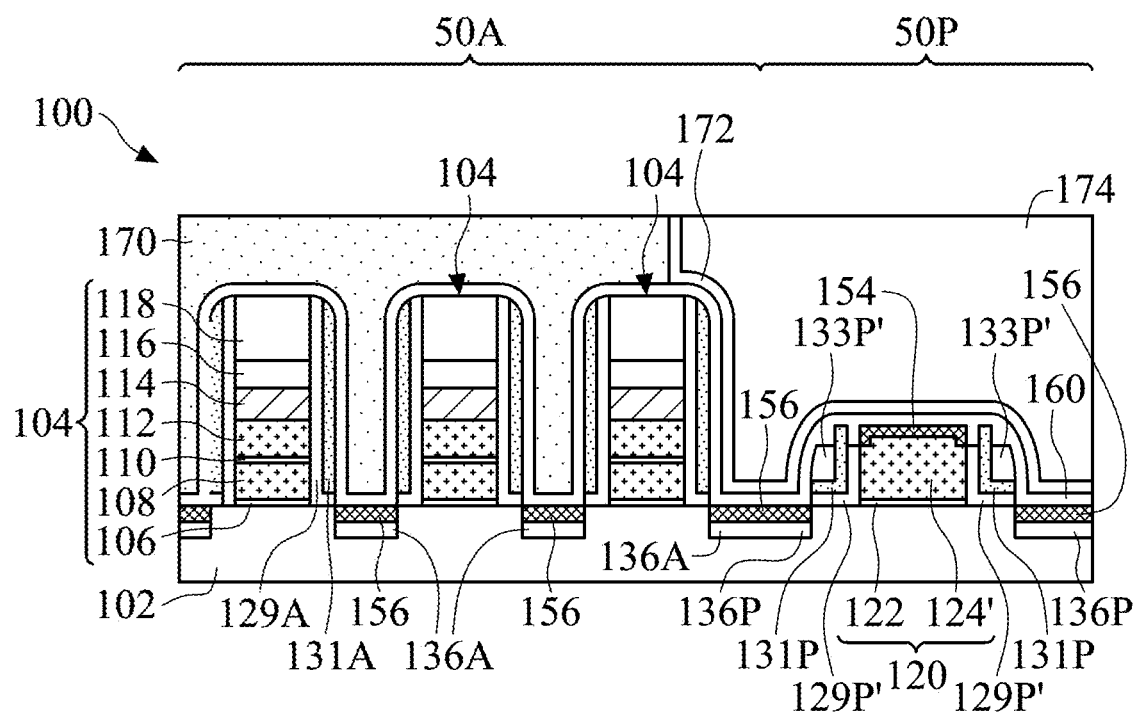
Figure 1M:
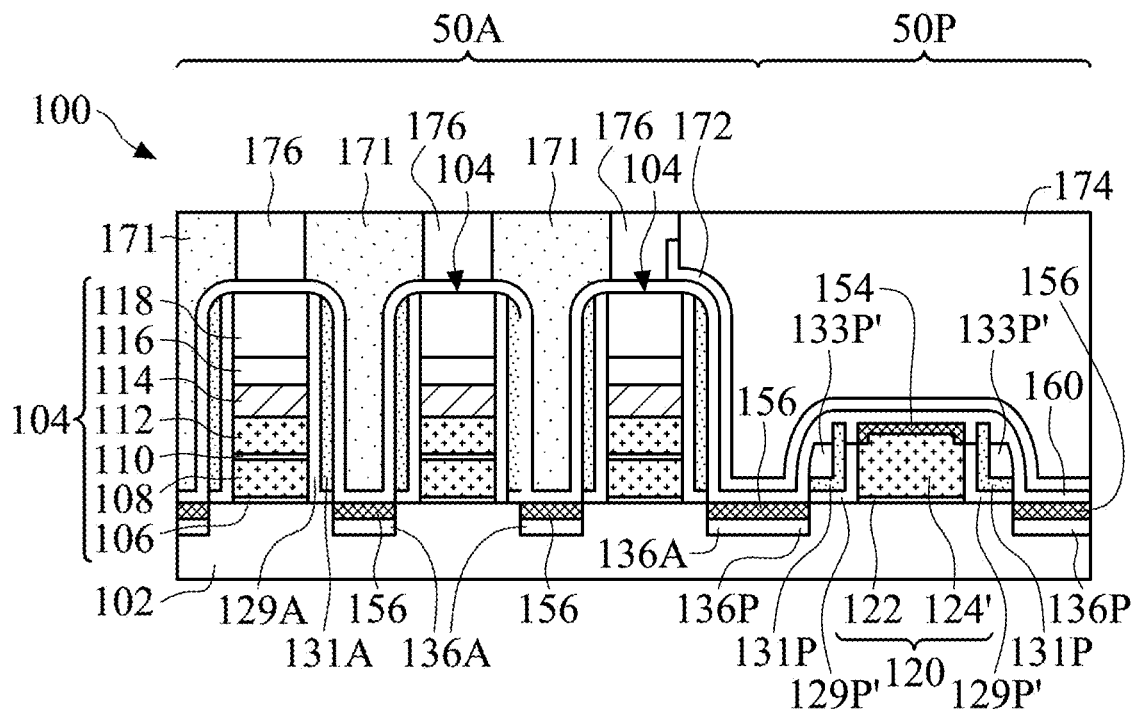
Figure 1N:
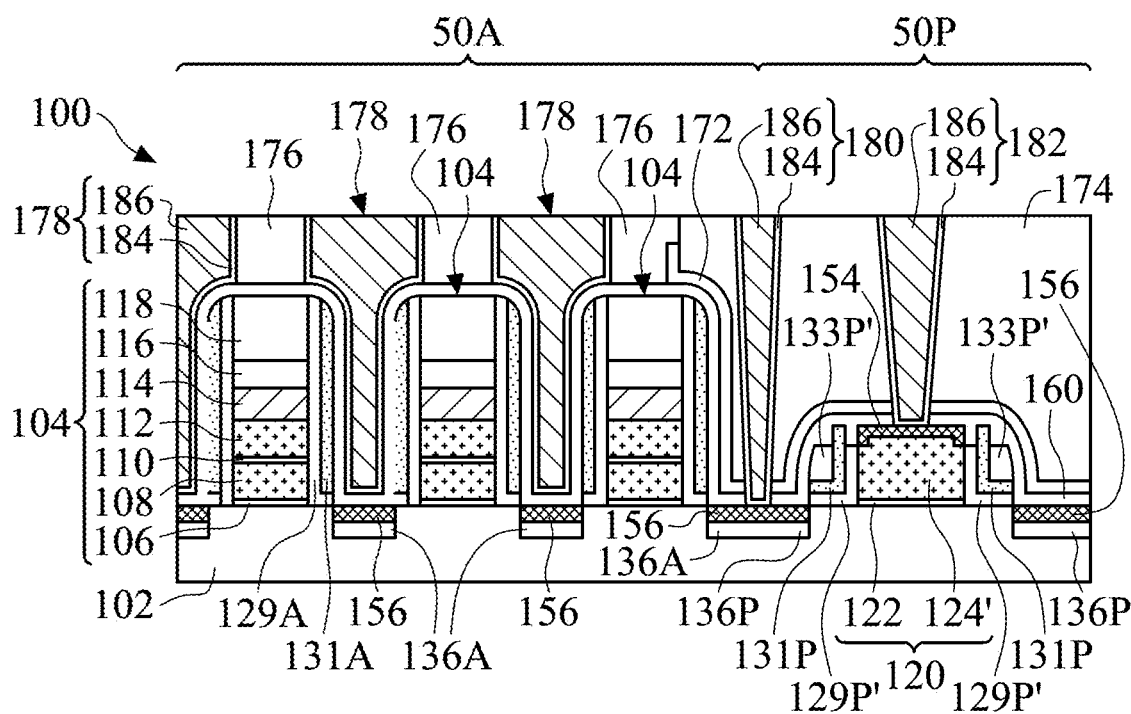

FIGS. 1A-1N illustrates cross-sectional views of forming a semiconductor structure at various stages in accordance with some embodiments of the present disclosure.

FIG. 1A illustrates a cross-sectional view of a semiconductor structure 100 which includes a memory cell array region 50A and a periphery circuitry region 50P. A semiconductor structure 100 is provided, in accordance with some embodiments. The semiconductor structure 100 includes a semiconductor substrate 102. In some embodiments, the semiconductor substrate 102 is an elemental semiconductor substrate, such as a silicon substrate or a germanium substrate; a compound semiconductor substrate, such as a silicon carbide substrate or a gallium arsenide substrate. In some embodiments, the semiconductor substrate 102 may be a semiconductor-on-insulator (SOI) substrate.

The semiconductor substrate 102 includes various device regions such as a memory cell array region 50A and a periphery circuitry region 50P, in accordance with some embodiments. The memory cell array region 50A includes memory cells 104 which are operable as data storage, in accordance with some embodiments. The periphery circuitry region 50P includes periphery circuitry devices which are configured as transistors, such as metal-oxide-semiconductor field effect transistors (MOSFETs), in accordance with some embodiments. The periphery circuitry devices in the periphery circuitry region 50P are operable to access and/or control (e.g. performs read/write/erase operation) the memory cells 104 in the memory cell array region 50A, in accordance with some embodiments.

The memory cells 104 are flash memories, such as NOR-type flash memories, in accordance with some embodiments. Openings 105 are formed between the memory cells 104 and expose the upper surface of the semiconductor substrate 102, in accordance with some embodiments. The memory cells 104 are stacked structures, each of which includes a tunneling oxide (Tox) layer 106, a floating gate 108, a gate dielectric layer 110, a control gate 112, a conductive layer 114, a first mask pattern 116 and a second mask pattern 118 sequentially formed over the semiconductor substrate 102, in accordance with some embodiments.

In some embodiments, the tunneling oxide layer 106 is made of silicon oxide; the floating gate 108 and the control gate 112 are made of a semiconductor material (such as polysilicon); the gate dielectric layer 110 is a tri-layer structure including oxide-nitride-oxide (ONO); the conductive layer 114 is made of metal such as tungsten (W), copper (Co), aluminum (Al), or another suitable material or metal silicide such as $WSi_x$; the first mask pattern 116 is made of nitride (such as silicon nitride); and the second mask pattern 118 is made of oxide (such as silicon oxide). In some embodiments, the first mask pattern 116 and the second mask pattern 118 are configured to define the pattern of the memory cell 104 during the patterning process (including photolithography and etching processes).

A gate structure 120 is formed in the periphery circuitry region 50P of the semiconductor substrate 102, in accordance with some embodiments. The gate structure 120 and source/drain regions subsequently formed on opposite sides of the gate structure 120 collectively build a transistor. The transistor is used as a component of the periphery circuitry devices and is electrically coupled to the memory cell 104 in the memory cell array region 50A through a multilayer interconnect structure subsequently formed there above.

The gate structure 120 includes a gate dielectric layer 122 formed over the upper surface of the semiconductor substrate 102 and a gate electrode layer 124 formed over the gate dielectric layer 122, in accordance with some embodiments. In some embodiments, the gate dielectric layer 122 is made of silicon oxide, silicon nitride, silicon oxynitride, or a combination thereof. In some embodiments, the gate electrode layer 124 is made of conductive material such as a semiconductor material (such as polysilicon). In some embodiments, the semiconductor material of the gate electrode layer 124 is doped to increase the conductivity of the semiconductor material.

A capping layer 126 is formed over the upper surface of the gate electrode layer 124, in accordance with some embodiments. In some embodiments, the capping layer 126 is made of a dielectric material such as silicon oxide, silicon oxynitride, silicon nitride, or a combination thereof. The capping layer 126 protects the gate structure 120 from being damaged due to the etching process during the patterning process for forming the memory cells 104, in accordance with some embodiments.

FIG. 1B illustrates a cross-sectional view of a semiconductor structure 100 after the formation of spacer materials 128, 130 and 132. A first spacer material 128, a second spacer material 130 and a third spacer material 132 are sequentially formed over the semiconductor structure 100, in accordance with some embodiments. The first spacer material 128 covers and conformally extends along the upper surface of the semiconductor substrate 102, the sidewalls and the upper surfaces of the memory cells 104, the sidewalls of the gate structure 120, and the sidewalls and the upper surface of the capping layer 126, in accordance with some embodiments. In some embodiments, the first spacer material 128 is made of silicon oxide.

The second spacer material 130 covers and conformally extends along the upper surface of the first spacer material 128, in accordance with some embodiments. In some embodiments, the second spacer material 130 is made of silicon nitride. The first spacer material 128 and the second spacer material 130 partially fill the openings 105, in accordance with some embodiments.

The third spacer material 132 is formed over the second spacer material 130, in accordance with some embodiments. The third spacer material 132 covers the memory cells 104 and the gate structure 120 and fills remainders of the openings 105, in accordance with some embodiments. In some embodiments, the third spacer material 132 is made of silicon oxide formed by such as tetraethylorthosilicate (TEOS).

FIG. 1C illustrates a cross-sectional view of a semiconductor structure 100 after the formation of spacer layers 133P. An etching process is performed on the third spacer material 132 in the periphery circuitry region 50P to form a pair of spacer layers 133P on the opposite sidewalls of the gate structure 120, in accordance with some embodiments. In some embodiments, an etching mask (not shown) such as photoresist is first formed using a photolithography process to cover the memory cell array region 50A, and an etching process such as anisotropic dry etching is then performed on the semiconductor structure 100.

The etching process removes portions of the third spacer material 132 formed over the upper surface of the semiconductor substrate 102 and the upper surface of the capping layer 126 until the second spacer material 130 is exposed, in accordance with some embodiments. After the etching process, portions of the third spacer material 132 along the sidewalls of the gate structure 120 remain as the spacer layers 133P, in accordance with some embodiments. An etching byproduct (such as a polymer) created by the dry etching process piles on the semiconductor structure 100, e.g., along the sidewalls of the gate structure 120, such that lateral etching amount of the third spacer material 132 deceases as the etching depth increase, in accordance with some embodiments. As a result, the spacer layers 133P formed along sidewalls of the gate structure 120 have upwardly decreasing widths.

After the spacer layers 133P are formed, the etching mask over the memory cell array region 50A is removed using a process such as an ashing process, and an etching mask (not shown, such as a photoresist) is formed using a photolithography process to cover the periphery circuitry region 50P, in accordance with some embodiments. An etching process such as wet etching is performed on the semiconductor structure 100 to remove the third spacer material 132 in the memory cell array 50A until the second spacer material 130 is exposed, in accordance with some embodiments. The third spacer layer 132 in the memory cell array 50A is removed entirely, in accordance with some embodiments. The etching mask over the periphery circuitry region 50P is removed using a process such as an ashing process, in accordance with some embodiments.

FIG. 1D illustrates a cross-sectional view of a semiconductor structure 100 after the formation of spacer layers 131A and 131P. An etching process such as dry etching is performed on the second spacer material 130 to form a pair of spacer layers 131A on the opposite sidewalls of the memory cell 104 and a pair of spacer layers 131P on the opposite sidewalls of the gate structure 120, in accordance with some embodiments.

In the memory cell array region 50A, the etching process removes horizontal portions of the second spacer material 130 (e.g., along the upper surface of the semiconductor substrate 102 and the upper surfaces of the memory cells 104) until the first spacer material 128 is exposed, in accordance with some embodiments. Vertical portions of the second spacer material 130 (e.g., along the sidewalls of the memory cell 104) remain as the spacer layers 131A, in accordance with some embodiments.

In the periphery circuitry region 50P, the etching process removes horizontal portions of the second spacer material 130 uncovered by the spacer layers 133P (e.g., along the upper surface of the semiconductor substrate 102 and the upper surface of the gate structure 120) until the first spacer material 128 is exposed, in accordance with some embodiments. Vertical portions of the second spacer material 130 along the sidewalls of the gate structure 120 and horizontal portions of the second spacer material 130 covered by the spacer layers 133P remain as the spacer layers 131P, in accordance with some embodiments. The spacer layer 131P has an L-shape profile in the cross-sectional view, in accordance with some embodiments.

FIG. 1E illustrates a cross-sectional view of a semiconductor structure 100 after the formation of spacer layers 129A and 129P. An etching process such as dry etching is performed on the first spacer material 128 to form a pair of spacer layers 129A on the opposite sides of the memory cell 104 and a pair of spacer layers 129P on the opposite sides of the gate structure 120, in accordance with some embodiments.

In the memory cell array region 50A, the etching process removes horizontal portions of the first spacer material 128 uncovered by the spacer layer 131A (e.g., along the upper surface of the semiconductor substrate 102 and the upper surfaces of the memory cells 104) until the upper surface of the semiconductor substrate 102 and the second mask patterns 118 of the memory cells 104 are exposed, in accordance with some embodiments. Vertical portions of the first spacer material 128 (e.g., along the sidewalls of the memory cell 104) and horizontal portions of the first spacer material 128 covered by the spacer layers 131A remain as the spacer layers 129A, in accordance with some embodiments. The spacer layer 129A has an L-shape profile in the cross-sectional view, in accordance with some embodiments. The spacer layers 129A and the spacer layers 131A in combination form cell spacer structures on the opposite sides of the memory cells 104, in accordance with some embodiments. The cell spacer structure is a bi-layer structure including oxide-nitride (ON).

In the periphery circuitry region 50P, the etching process removes horizontal portions of the first spacer material 128 uncovered by the spacer layer 131P (e.g., along the upper surface of the semiconductor substrate 102 and the upper surface of the gate structure 120) until the semiconductor substrate 102 and the capping layer 126 are exposed, in accordance with some embodiments. Vertical portions of the first spacer material 128 along the sidewalls of the gate structure 120 and horizontal portions the first spacer material 128 covered by the spacer layers 131P remain as the spacer layers 129P, in accordance with some embodiments. The spacer layer 129P has an L-shape profile in the cross-sectional view, in accordance with some embodiments. The spacer layers 129P, the spacer layers 131P and the spacer layer 133P in combination form gate spacer structures on the opposite sides of the gate structure 120, in accordance with some embodiments. The gate structure 120 is a tri-layer structure including oxide-nitride-oxide (ONO). In some embodiments, the capping layer 126 protects the gate electrode layer 124 from being damaged due to the etching process.

FIG. 1F illustrates a cross-sectional view of a semiconductor structure 100 after the formation of a sacrificial layer 134 and source/drain regions 136A and 136P. A sacrificial layer 134 is formed to cover and extend along the semiconductor substrate 102, the cell spacer structure (including spacer layers 129A and 131A), the memory cells 104, the gate spacer structure (including spacer layers 129P, 131P and 133P), and the capping layer 126, in accordance with some embodiments. The sacrificial layer 134 may be referred to as a screen oxide and configured to increase the quality of a subsequent ion implantation process.

In some embodiments, the sacrificial layer 134 is made of a thin oxide layer such as silicon oxide.

An ion implantation process is performed on the semiconductor structure 100 to form source/drain regions 136A in the semiconductor substrate 102 at the memory cell array region 50A and source/drain regions 136P in the semiconductor substrate 102 at the periphery circuitry region 50P, in accordance with some embodiments. The gate structure 120 and an adjacent pair of source/drain regions 136P build a transistor in the periphery circuitry region 50P, which is used as a component of periphery circuitry device, in accordance with some embodiments. A source/drain region 136A and a source/drain region 135P which are located at a boundary between the memory cell array region 50A and the periphery circuitry region 50P, may share a common doped region.

FIG. 1G illustrate a cross-sectional view of a semiconductor structure 100 after the removal of the sacrificial layer 134 and the capping layer 126. An etching process is performed on the semiconductor structure 100 to remove the sacrificial layer 134 and the capping layer 126, in accordance with some embodiments. In some embodiments, the etching process is wet etching. Because the sacrificial layer 134 is thin (e.g., with a thickness of about 10 nm to about 15 nm), an oxide layer (e.g., TESO oxide with a thickness of about 3 nm to about 7 nm) may be formed over the sacrificial layer 134 before the etching process, which may prevent the semiconductor surface of the semiconductor substrate 102 and the gate electrode layer 124 being damage due to etching process. After the etching process, the upper surface of the semiconductor substrate 102, the upper surface of the gate electrode layer 124 of the gate structure 120 are exposed. Metal silicide is to be formed on these exposed surfaces.

FIG. 1H illustrates a cross-sectional view of a semiconductor structure 100 after a trimming process for the gate spacer structure. An etching process is performed on the semiconductor structure 100 to trim the gate spacer structure in the periphery circuitry region 50P, in accordance with some embodiments. The etching process recesses upper portions of the spacer layers 129P and upper portions of the spacer layers 133P, thereby forming recesses 138 and 140 respectively, in accordance with some embodiments. The spacer layers 131P remain unetched during the etching process, in accordance with some embodiments. The recessed spacer layer 129P and the recessed spacer layer 133P are referred to as a spacer layer 129P' and a spacer layer 133P' respectively, in accordance with some embodiments. As-trimmed gate spacer structure includes the spacer layer 131P protruding from between the spacer layer 129P' and the spacer layer 133P', in accordance with some embodiments. In addition, the spacer layer 129P' and the spacer layer 133P' each have a substantially flat upper surface, in accordance with some embodiments. The upper surface of the spacer layer 129P' and the upper surface of the spacer layer 133P' are located at substantially the same level, in accordance with some embodiments.

In some embodiments, an etching mask may be formed over the memory cell array region 50A before the trimming process and removed after the trimming process. In some other embodiments where no etching mask is formed over the memory cell array region 50A, the second mask patterns 118 and the spacer layers 129A are also etched.

In some embodiments, the etching process is a dry chemical etching process which uses gas phase dilute hydrofluoric (dHF) acid as an etchant. During the etching process, the oxide of the spacer layers 129P and 133P has a different etching selectivity than the nitride of the spacer layer 131P. In specific, the etching rate of the nitride of the spacer layer 131P is much less than the etching rate of the oxide of the spacer layers 129P and 133P, in accordance with some embodiments.

In addition, during the etching process, the dry chemical etching process may maintain the lateral etching amount as the etching depth increases, in accordance with some embodiment. That is, during the etching process, the material of the spacer layer 129P and/or an etching byproduct do not remain in the recess 138 on the sidewall of the gate electrode layer 124 and the sidewall of the spacer layer 131P. Similarly, the material of the spacer layer 133P and/or an etching byproduct do not remain in the recess 140 on the other of the sidewall of the spacer layer 131P. As a result, after the etching process, upper portions of the sidewalls of the gate electrode layer 124 are exposed from the recesses 138, in accordance with some embodiments. Metal silicide are to be formed on these exposed surfaces. Opposite sidewalls of the vertical portions of the spacer layers 131P have upper portions 131S which are exposed from the recesses 138 and 140, in accordance with some embodiments.

In some embodiments, the etching process recesses the spacer layer 129P and the spacer layer 133P to a depth D1 which is in a range from about 3 nm to about 30 nm, such as about 3 nm. In some embodiments, the vertical portion of the spacer layer 129 has a thickness D2 along the sidewall of the gate structure 120. The thickness D2 is in a range from about 15 nm to about 60 nm, such as about 30 nm. In some embodiments, the ratio of the depth D1 to the thickness D2 is in a range from about 0.05 to about 2, such as about 0.17. The etching depth D1 (or the ratio of the depth D1 to the thickness D2) may be optimized for transistor performance consideration. For example, if the etching depth D1 (or the ratio of the depth D1 to the thickness D2) is too small, the contact area of a subsequently formed metal material with the upper portion 124S of the sidewalls of the gate electrode layer 124 is too small. This will be described in detail below. For example, if the etching depth D1 (or the ratio of the depth D1 to the thickness D2) is too large, the gate leakage current of the resulting transistor may increase. In some embodiments, the gate structure 120 has a thickness D2 in a range from about 200 nm to about 300 nm.

FIG. 1I illustrates a cross-sectional view of a semiconductor structure 100 after the formation of a metal material 152 for silicide layers. A metal material 152 is deposited over the semiconductor structure 100, in accordance with some embodiments. Before the metal material 152 is formed, the exposed semiconductor surfaces of the semiconductor substrate 102 and the gate electrode layer 124 may be cleaned using an etching process to remove native oxide formed on the semiconductor surfaces of the semiconductor substrate 102 and the gate electrode layer 124. The clean process and the deposition process may be performed in-situ in the same equipment, thereby preventing the exposed semiconductor surfaces from being exposed to an oxygen-containing ambient during the semiconductor substrate 102 is transferred from a cleaning chamber to a deposition chamber where the metal material 152 is deposited.

In the memory cell array region 50A, the metal material 152 covers and extends along the semiconductor substrate 102, the cell spacer structures, and the memory cells 104, in accordance with some embodiments. The metal material 152 is in direct contact with the semiconductor material (e.g., silicon) of the semiconductor substrate 102 at the upper surface of the semiconductor substrate 102, in accordance with some embodiments.

In the periphery circuitry region 50P, the metal material 152 covers and extends along the semiconductor substrate 102, the gate spacer structures, and the gate structure 120, in accordance with some embodiments. The metal material 152 fills the recesses 138 and 140 to abut the upper surface of the spacer layer 133P' and the upper surface of the vertical portion of the spacer layer 129P', in accordance with some embodiments. The metal material 152 wraps around the protruding portion of the spacer layer 131P and the upper portion of the gate electrode layer 124, in accordance with some embodiments. The metal material 152 is in direct contact with the semiconductor material (e.g., silicon) of the gate electrode layer 124 at the upper surface and the upper portions 124S (FIG. 1H) of the sidewalls of the gate electrode layer 124, in accordance with some embodiments. As such, the metal material 152 covers the corners between the upper surface and the sidewall of the gate electrode layer 124, in accordance with some embodiments.

In some embodiments, the metal material 152 is cobalt (Co), nickel (Ni), titanium (Ti), tungsten (W), or another material suitable for forming silicide.

FIG. 1J illustrates a cross-sectional view of a semiconductor structure 100 after the formation of silicide layers 154 and 156. An anneal process is performed on the semiconductor structure 100 to form a silicide layer 154 on the gate electrode layer 124 and silicide layers 156 on the source/drain regions 156A and 156P, in accordance with some embodiments. The silicide layers 154 and 156 may also be referred to as self-aligned silicide (salicide). During the anneal process, the semiconductor material (such as silicon) of the semiconductor substrate 102 and the gate electrode layer 124 is reacted with the metal material 152, such that portions of the semiconductor material contacting the metal material 152 are transformed into metal silicide, such as cobalt silicide (CoSi), nickel silicide (NiSi), titanium silicide (TiSi), tungsten silicide (WSi), or another suitable metal silicide. Portions of the gate electrode layer 124 unreacted with the metal material 152 are referred to as a gate electrode layer 124', in accordance with some embodiments. In some embodiments, the anneal process may be performed at a temperature of about 250° C. to about 450° C. for a duration of about 30 seconds to about 30 minutes.

After the silicide layer 154 and 156 are formed, portions of the metal material 152 unreacted with the semiconductor material are removed, thereby exposing the recesses 138 and 140 again, in accordance with some embodiments. In some embodiments, the recess 138 exposes the sidewalls of the silicide layer 154. In some embodiments, the removal process is a wet etching process.

FIG. 1J-1 is an area A shown in FIG. 1J to illustrate additional details of the silicide layer 154. The silicide layer 154 has an inverted U-shape in the cross-sectional view, in accordance with some embodiments. The silicide layer 154 includes a central portion 154C and peripheral portions 154P, in accordance with some embodiments. The peripheral portions 154P are located around the central portion 154C and at the edges (or corner) of the original gate structure 124, in accordance with some embodiments. In some embodiments, the peripheral portions 154P of the silicide layer 154 may have a bottom surface 154B2 which is located at a level below, equal to or above the bottom surface 154B1 of the central portion 154C of the silicide layer 154, in accordance with some embodiments.

It is noted that in an instance where the metal material is formed only over the upper surface of the gate electrode layer, a silicide layer may be formed with a poor thickness uniformity, because the silicide layer may have a much thinner thickness at the edge of the gate electrode layer than a thickness at the center of the gate electrode layer. Or, there is no silicide layer formed at the edge of the gate electrode layer. It may limit the process window of a photolithography process during a subsequent patterning process for forming a contact opening to the gate structure. For example, when a contact plug formed in the contact opening lands on the edge of the gate structure where no silicide layer is formed, an open circuit may happen, thereby reducing the performance of the semiconductor device.

In the embodiments of the present disclosure, because of the trimming process, the metal material 152 is in contact with the upper surface and the upper portions 124S (FIG. 1H) of the sidewalls of the gate electrode layer 124, thereby covering the corner of the gate electrode layer 124. As a result, the silicide layer 154 formed has the peripheral portions 154P with a greater thickness at the edge of the gate electrode layer 124', which may improve the uniformity of the silicide layer 154, e.g., a better uniformity. Therefore, the process window of a photolithography process may be enlarged during a subsequent patterning process for forming a contact opening to the gate structure. For example, overlay window and/or critical dimension (CD) window may be enlarged, thereby increasing the reliability and the manufacturing yield of the semiconductor device. A thickness D4 of the central portion 154C of the silicide layer 154 is less than a thickness D5 of the peripheral region 154P of the silicide layer 154, in accordance with some embodiments.

In some embodiments, the thickness D4 of the central portion 154C of the silicide layer 154 is in a range from about 10 nm to about 30 nm. In some embodiments, the thickness D5 of the peripheral region 154P of the silicide layer 154 is in a range from about 15 nm to about 45 nm. The ratio of the thickness D5 to the thickness D4 may be optimized for transistor performance consideration. For example, if the thickness D5 to the thickness D4 is too small, the process window of a subsequent photolithography process may be not enough. For example, if the thickness D5 to the thickness D4 is too large, the gate leakage current of the resulting transistor may increase.

Because the peripheral region 154P of the silicide layer 154 is formed by self-align, the sidewall of the peripheral region 154P is not covered by the spacer layer 129P', in accordance with some embodiments. The upper surface 129T of the spacer layer 129P' and the bottom surface 154B2 of the peripheral region 154P of the silicide layer 154 are located at substantially the same level, in accordance with some embodiments. The silicide layer 154 wraps around the upper portion of the gate electrode layer 124', and the spacer layer 129P' surrounds the lower portion of the gate electrode layer 124', in accordance with some embodiments. The sidewall of the upper portion of the gate electrode layer 124' is indented from the sidewall of the lower portion of the gate electrode layer 124' by a distance, e.g., substantially equal to a width D6 of the peripheral region 154P, in accordance with some embodiments. The sidewall of the lower portion of the gate electrode layer 124' is aligned with the sidewall of the peripheral region 154P of the silicide layer 154, in accordance with some embodiments. The upper surface 131T of the spacer layer 131P is located at a higher level than the upper surface 129T of the spacer layer 129P' and the upper surface 133T of the spacer layer 133P', in accordance with some embodiments.

In some embodiments, the peripheral region 154P of the silicide layer 154 has a width D6. In some embodiments, the ratio of the thickness D5 to the width D6 is in a range from about 1.5 to about 3. In some embodiments, the ratio of width D6 to width D7 is in a range from about 20 to about 100.

FIG. 1K illustrates a cross-sectional view of a semiconductor structure 100 after the formation of a protection layer 160. A protection layer 160 is formed to cover and extend along the silicide layers 156, cell spacer structures (including spacers 129A and 131A), the memory cells 104, gate spacer structure (including spacers 129P', 131P and 133P'), and the silicide layers 154, in accordance with some embodiments. The protection layer 160 fills the recesses 138 and 140 to abut the upper surface 133T of the spacer layer 133P' and the upper surface 129T of the vertical portion of the spacer layer 129P', in accordance with some embodiments.

FIGS. 1L-1N illustrate cross-sectional views of the formation of contact plugs 178 and 180 to the source/drain regions and a contact plug 182 to the gate structure.

A polysilicon layer 170 is formed using a deposition process and a patterning process to cover the memory cell array region 50A of the semiconductor structure 100 and fill remainders of the openings 105, as shown in FIG. 1L, in accordance with some embodiments. The polysilicon layer 170 partially covers a memory cell 104 near the boundary between the memory cell array region 50A and the periphery circuitry region 50P, in accordance with some embodiments. An etching stop layer 172 is conformally formed over the semiconductor structure 100, and an interlayer dielectric layer 174 is then formed over the etching stop layer 172, in accordance with some embodiments. Afterward, a removal process is performed on the interlayer dielectric layer 174 and the etching stop layer 172. For example, a first chemical mechanical polishing (CMP) process is performed on the interlayer dielectric layer 174 until the etching stop layer 172 formed over the polysilicon layer 170 is exposed. Next, the etching stop layer 172 formed over the polysilicon layer 170 is removed using a process such as wet etching. A second CMP process is then performed on the interlayer dielectric layer 174 and the polysilicon layer 170, such that the upper surface of the interlayer dielectric layer 174 is substantially coplanar with the upper surface of the polysilicon layer 170, in accordance with some embodiments.

A patterning process is performed on the polysilicon layer 170 to form sacrificial contract plugs 171 in the openings 105 between the memory cells 104, as shown in FIG. 1M, in accordance with some embodiments. Mask elements 176 are then formed over the memory cells 104 to fill the spaces between the sacrificial contract plugs 171, in accordance with some embodiments. In some embodiments, the mask element 176 is made of nitride such as silicon nitride.

The sacrificial contract plugs 171 and the protection layer 160 below the sacrificial contract plugs 171 are etched away to form contact opening (not shown) exposing the silicide layer 156 formed on the source/drain region 136A, in accordance with some embodiments.

A patterning process (including a photolithography process and an etching process) is performed on the interlayer dielectric layer 174, the etching process 172 and the protection layer 160 to form a contact opening (not shown) exposing the silicide layer 156 formed on the source/drain region 136P and a contact opening (not shown) exposing the silicide layer 154 formed on the gate structure 120, in accordance with some embodiments.

A barrier layer 184 is conformally formed along the sidewalls and the bottom surface of the contact openings, and a conductive material 186 is then formed to fill remainders of the contact opening, as shown in FIG. 1N, in accordance with some embodiments. The barrier layer 184A and the conductive material 186 formed above the mask element 176 and the interlayer dielectric layer 174 may be removed using CMP process, thereby forming contact plugs 178, 180 and 182, in accordance with some embodiments. The contact plugs 178 land on the silicide layers 156 on the source/drain regions 136A; the contact plug 180 lands on the silicide layer 156 on the source/drain regions 136P; and contact plug 182 lands on the silicide layer 154 on the gate structure 120, in accordance with some embodiments.

In some embodiments, additional components may be formed over the semiconductor structure 100 of FIG. 1N, thereby producing a semiconductor memory device such as a flash memory device, in accordance with some embodiments. For example, a multilayer interconnect structure (e.g., including conductive lines and vias in intermetal dielectric layers) may be formed over the semiconductor structure 100 to electrically couple the memory cell 104 in the memory cell array region 50A and the periphery circuitry device in the periphery circuitry region 50P.

Figure 2:
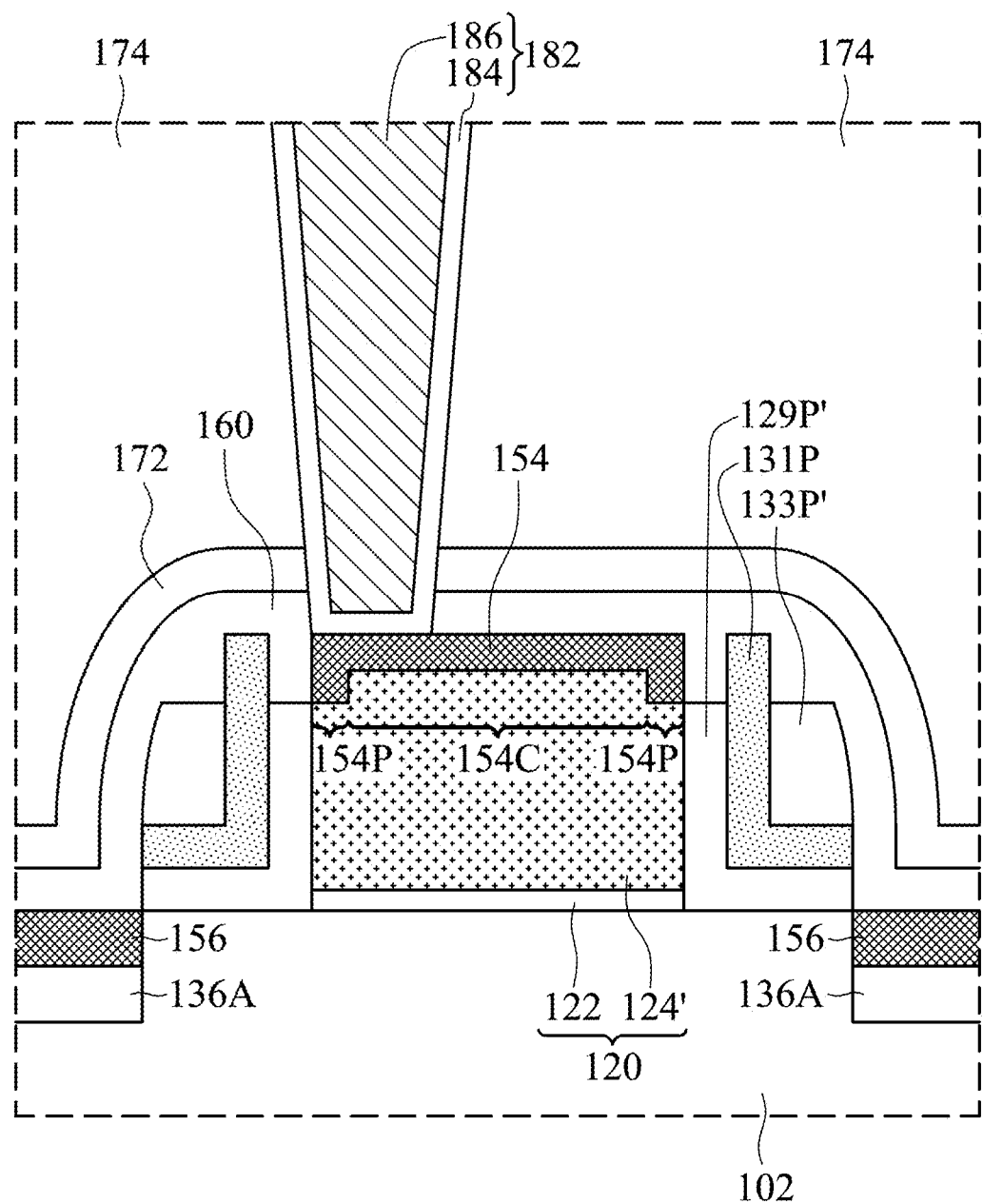
FIG. 2 illustrates a modification of the semiconductor structure of FIG. 1N in accordance with some embodiments of the present disclosure.

FIG. 2 illustrates a modification of the semiconductor structure of FIG. 1N in accordance with some embodiments of the present disclosure. FIG. 2 shows a transistor structure which is similar to the transistor structure shown in FIG. 1N except that a contact plug 182 shown in FIG. 2 lands on the silicide layer 154 at the edge of the gate structure 120. In detail, the contact plug 182 overlays and contacts the peripheral portion 154P of the silicide layer 154. Because the silicide layer 154 includes the peripheral portion 154P with a greater thickness, the problem of the open circuit described above may be avoided.

As described above, the embodiments of the present disclosure provide a method for forming a semiconductor structure. By trimming the gate spacer structure (e.g., recessing the spacer layer 129P and 133P), the metal material for forming the silicide layer can cover the upper surface and the upper portion of the sidewalls of the gate electrode layer. As a result, in the embodiments of the present disclosure, the silicide layer formed has a greater thickness at the edge (or corner) of the gate electrode layer. Therefore, the process window of forming the contact plug to the gate structure may be enlarged, thereby increasing the reliability and the manufacturing yield of the semiconductor device.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a semiconductor structure, comprising:
    forming a gate electrode layer over a semiconductor substrate;
    forming a first spacer layer to cover a sidewall of the gate electrode layer;
    forming a second spacer layer to cover a sidewall of the first spacer layer;
    forming a third spacer layer to cover a sidewall of the second spacer layer;
    recessing the first spacer layer to expose an upper portion of the sidewall of the gate electrode layer;
    forming a metal material to cover an upper surface and the upper portion of the sidewall of the gate electrode layer;
    reacting a semiconductor material of the gate electrode layer with the metal material using an anneal process to form a silicide layer; and
    removing the metal material after the anneal process, wherein an upper surface of the silicide layer is level with a flat upper surface of the second spacer layer, and the silicide layer is spaced apart from the second spacer layer by a width of the first spacer layer.

2. The method for forming the semiconductor structure as claimed in claim 1, wherein a material of the second spacer layer is different than a material of the first spacer layer, a material of the third spacer layer is different than the material of the second spacer layer.

3. The method for forming the semiconductor structure as claimed in claim 2, wherein the first spacer layer is recessed to form a recess between the gate electrode layer and the second spacer layer, and the metal material is formed to fill the recess.

4. The method for forming the semiconductor structure as claimed in claim 2, further comprising:
    recessing the third spacer layer while recessing the first spacer layer such that the second spacer layer protrudes from between the first spacer layer and the third spacer layer,
    wherein the metal material is formed to wrap around a portion of the second spacer layer protruding from between the first spacer layer and the third spacer layer.

5. The method for forming the semiconductor structure as claimed in claim 2, wherein the semiconductor substrate includes a memory cell array region having memory cells and a periphery circuitry region, and the gate electrode layer is formed in the periphery circuitry region, wherein the method further comprises:
    forming a capping layer on an upper surface of the gate electrode layer, and the forming of the first and second spacer layers comprises:
        etching the material of the first spacer layer and the material of the second spacer layer until the semiconductor substrate and the capping layer are exposed.

6. The method for forming the semiconductor structure as claimed in claim 1, wherein the silicide layer includes a central portion and a peripheral portion around the central portion, and a bottom surface of the peripheral portion is located at a lower level than a bottom surface of the central portion.

7. The method for forming the semiconductor structure as claimed in claim 6, wherein the bottom surface of the peripheral portion is located at a same level as an upper surface of the first spacer layer.

8. The method for forming the semiconductor structure as claimed in claim 6, wherein the metal material is removed to expose a sidewall of the peripheral portion of the silicide layer.

9. The method for forming the semiconductor structure as claimed in claim 1 further comprising:
    forming a protection layer over the silicide layer, wherein the protection layer abuts the recessed first spacer layer.

10. The method for forming the semiconductor structure as claimed in claim 9 further comprising:
    forming an interlayer dielectric layer over the protection layer; and
    forming a contact plug through the interlayer dielectric layer and the protection layer to the silicide layer.

11. A semiconductor structure, comprising:
    a semiconductor substrate;
    a gate electrode layer disposed over the semiconductor substrate;
    a silicide layer wrapping around an upper portion of the gate electrode layer;
    a first spacer layer surrounding a lower portion of the gate electrode layer;
    a second spacer layer disposed along a sidewall of the first spacer layer; and
    a third spacer layer disposed along a sidewall of the second spacer layer,
    wherein the silicide layer includes a central portion and a peripheral portion around the central portion, an upper surface of the silicide layer is level with a flat upper surface of the second spacer layer, the silicide layer is spaced apart from the second spacer layer by a width of the first spacer layer, and a first bottom surface of the peripheral portion is located at a same level as an upper surface of the first spacer layer.

12. The semiconductor structure as claimed in claim 11, wherein the first bottom surface of the peripheral portion is located at a lower level than a second bottom surface of the central portion.

13. The semiconductor structure as claimed in claim 11, wherein the second spacer layer protrudes from between the first spacer layer and the third spacer layer.

14. The semiconductor structure as claimed in claim 11, wherein the first spacer layer and the third spacer layer are made of oxide and the second spacer layer is made of nitride.

15. The semiconductor structure as claimed in claim 11, further comprising:
   a protection layer disposed over the silicide layer, wherein the protection layer extends between the second spacer layer and the silicide layer, and abuts the first spacer layer.

16. The semiconductor structure as claimed in claim 11, wherein the silicide layer is made of cobalt silicide (CoSi), nickel silicide (NiSi), titanium silicide (TiSi), or tungsten silicide (WSi).

17. The semiconductor structure as claimed in claim 11, wherein the upper portion of the gate electrode layer has a first sidewall and the lower portion of the gate electrode layer has a second sidewall, and the first sidewall is indented from the second sidewall by a distance.

18. The semiconductor structure as claimed in claim 11, further comprising:
   an interlayer dielectric layer disposed over the silicide layer; and
   a contact plug through the interlayer dielectric layer to the silicide layer.

19. The semiconductor structure as claimed in claim 18, wherein the contact plug lands on the peripheral portion of the silicide layer.

* * * * *